US006496953B1

(12) United States Patent
Helland (10) Patent No.: US 6,496,953 B1
(45) Date of Patent: Dec. 17, 2002

(54) CALIBRATION METHOD AND APPARATUS FOR CORRECTING PULSE WIDTH TIMING ERRORS IN INTEGRATED CIRCUIT TESTING

(75) Inventor: Joseph C. Helland, San Jose, CA (US)

(73) Assignee: Schlumberger Technologies, Inc., San Jose, CA (US)

(*) Notice: Subject to any disclaimer, the term of this patent is extended or adjusted under 35 U.S.C. 154(b) by 0 days.

(21) Appl. No.: 09/526,407

(22) Filed: Mar. 15, 2000

(51) Int. Cl.[7] .................................................. G06F 11/00
(52) U.S. Cl. ........................................ 714/744; 714/731
(58) Field of Search ................................. 714/744, 731; 324/73.1, 500

(56) References Cited

U.S. PATENT DOCUMENTS

| | | | |
|---|---|---|---|
| 5,212,443 A | 5/1993 | West et al. | 324/158 R |
| 5,461,310 A | 10/1995 | Cheung et al. | 324/158.1 |
| 5,477,139 A | 12/1995 | West et al. | 324/158.1 |
| 6,360,343 B1 * | 3/2002 | Turnquist | 714/731 |

* cited by examiner

Primary Examiner—Phung M. Chung
(74) Attorney, Agent, or Firm—Skjerven Morrill LLP; Norman R. Klivans (57) ABSTRACT

A method and apparata for correcting for pulse width timing error during testing of an integrated circuit are described. The method includes storing in a memory, associated with a selected terminal of an integrated circuit, event timing data pertaining to testing of the integrated circuit. Functional data is provided, pertaining to the testing, and it is determined if the functional data causes a state transition in the integrated circuit, the state transition causing a pulse. If a pulse is created, then the event timing data is adjusted, thereby to produce pulse width adjusted event timing. A test signal is then applied to the selected terminal of the integrated circuit, the test signal including pulse width adjusted event timing.

A test program first loads scrambler and sequencer memories with a code representing event timing data and event type data for a number of events that are to occur during a test vector, as specified by the user. According to one embodiment, to implement single value pulse width calibration, additional coding is provided that reflects variations on event timing values compensating for pulse width timing error. Circuitry external to the local event sequencer of the tester analyzes the stream of functional data describing event polarity during every test cycle, and determines if a given bit of functional data ends a "short" pulse. The results of this analysis become part of the data stored in the scrambler memory. These data act as a pointer to select the address in the sequencer memory that contains the correct pulse width adjusted event timing data. According to another embodiment which implements general pulse width calibration, the event sequencer is modified to include pulse width calculation circuitry, which stores event time and event type data for the most recent events and calculates the pulse width of the present event by subtracting the nominal time value of the most recent event of the opposite polarity from the nominal time value of the present event. This pulse width value addresses a lookup table, which provides a corresponding calibration factor, to create pulse width adjusted event timing.

21 Claims, 5 Drawing Sheets

CALIBRATION METHOD AND APPARATUS FOR CORRECTING PULSE WIDTH TIMING ERRORS IN INTEGRATED CIRCUIT TESTING

FIELD OF THE INVENTION

This invention relates to automated test equipment for testing integrated electronic circuits, and more particularly to correcting for pulse width timing errors in such equipment.

BACKGROUND

Automated test equipment (ATE) is used for testing (e.g., in a semiconductor chip fabrication facility) to simulate the operating conditions that an integrated circuit (chip) will experience when used in the field. An integrated circuit undergoing testing is also known as a device under test (DUT).

The ATE is controlled by an associated computer or processor which executes a set of instructions (the test program). The ATE must supply signals having the correct voltages, currents, timings and functional states to the DUT and monitor the responses from the DUT. The ATE then compares the responses from each test to pre-defined limits and a pass/fail decision is made.

Figure 1:
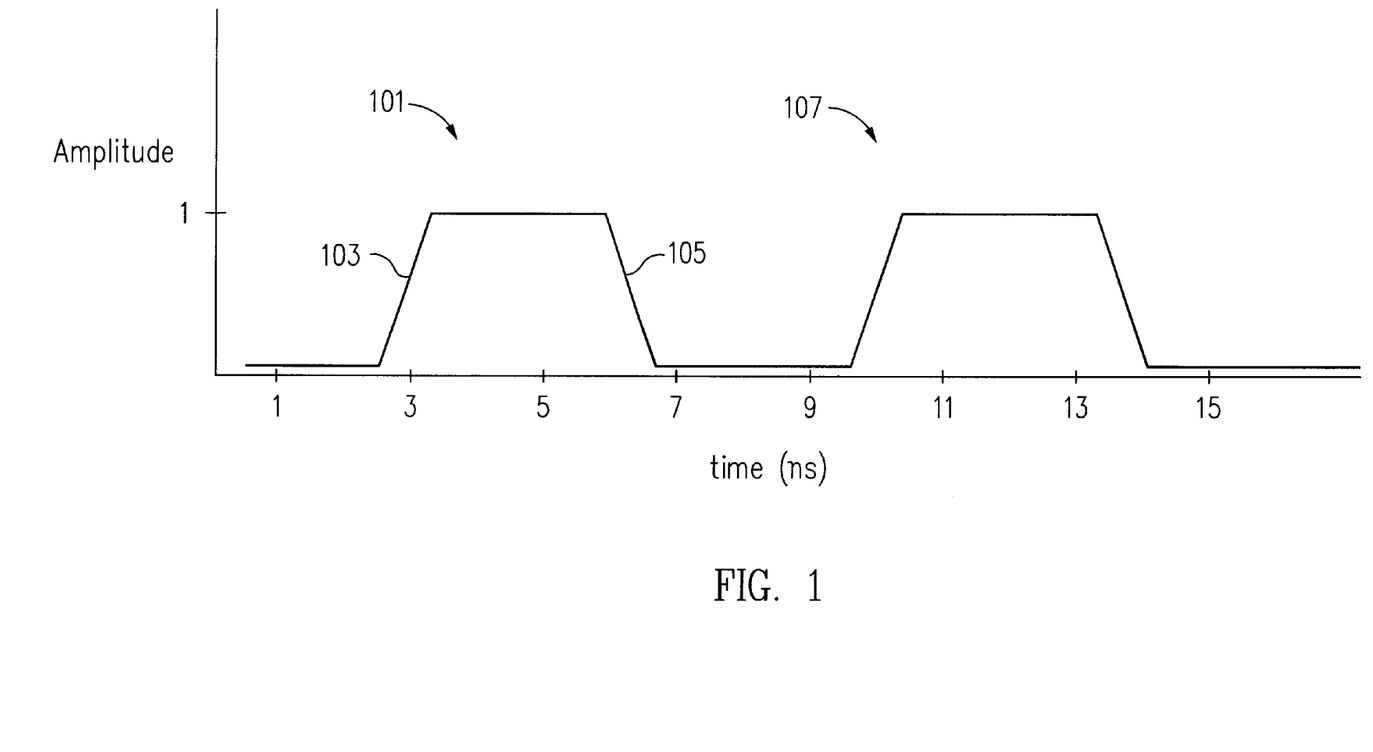
FIG. 1 shows a series of waveforms as generated by a tester when supplying signals to a device under test (DUT).

A test "event" is a pair expressed as the notation (S, T) where "S" is a functional state and "T" is the time associated with the transition to S. An "event sequence" is a time-ordered list of such pairs. For example, in the signal waveform shown in FIG. 1, the event sequence has four events expressed as (D1, 3), (D0, 7), (D1,10), and (D0, 14). The first event drives the signal to a high state (1) at time=3 nanoseconds (ns). The second event drives the signal to a low state (0) at time=7 ns. The third event drives to a high at time=10 ns and the fourth event drives to a low at time=14 ns. ("Amplitude" in FIG. 1 is a signal voltage which is set by the test program.)

The first two events can be said to describe a pulse 101—a transient signal that is of short duration, and one polarity. The pulse has a leading edge 103 and a trailing edge 105. The pulse width, or pulse duration, is the time interval between points on the leading and trailing edges at a specific voltage value, usually the time interval between the half amplitude points of the pulse. Thus, the pulse width of pulse 101 is about 4 nanoseconds (ns). Similarly, the pulse width of pulse 107 is about 4 ns.

Figure 2:
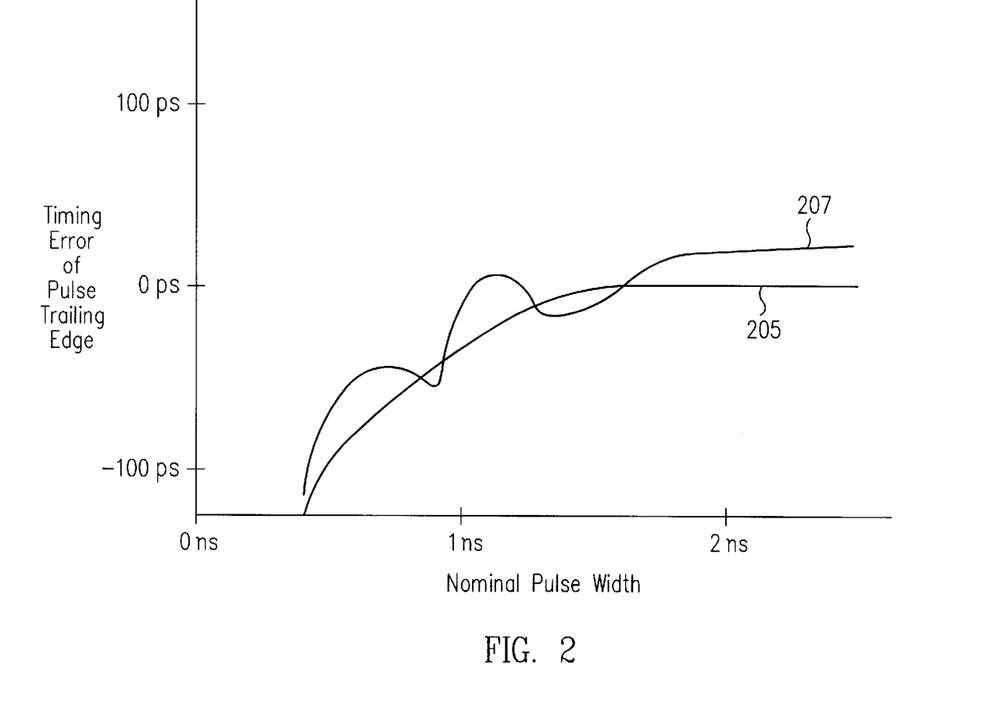
FIG. 2 shows the timing error of a pulse trailing edge as a function of nominal pulse width.

ATE signals are affected by many error sources, but among the most significant in high performance testers is an error related to pulse width, as shown in FIG. 2. As the intended (nominal) pulse width becomes smaller, it becomes less likely that the pulse will reach full amplitude before it is instructed by the tester to reverse itself. Therefore, the trailing edge of the pulse occurs earlier than desired. The actual pulse width is less than the nominal pulse width, and a timing error results. Line 205 depicts the error curve, which indicates that the timing error increases as nominal pulse width decreases. The error curve could be more erratic, as shown in line 207. As long as the error curve is predictable, however, pulse width timing error could be accounted for. A pulse width timing error has been found to occur on a particular tester when the pulse width is decreased to 1.25 ns or less. Thus, the second of two timing edges that are intended to be 1 ns apart will have a timing error if and only if the following 3 conditions are satisfied: 1) 1 ns is sufficiently small to cause the small pulse error for the circuit; 2) the first edge actually caused a transition in the state of functional data; and 3) the second edge is of opposite polarity from the first.

Figure 3:
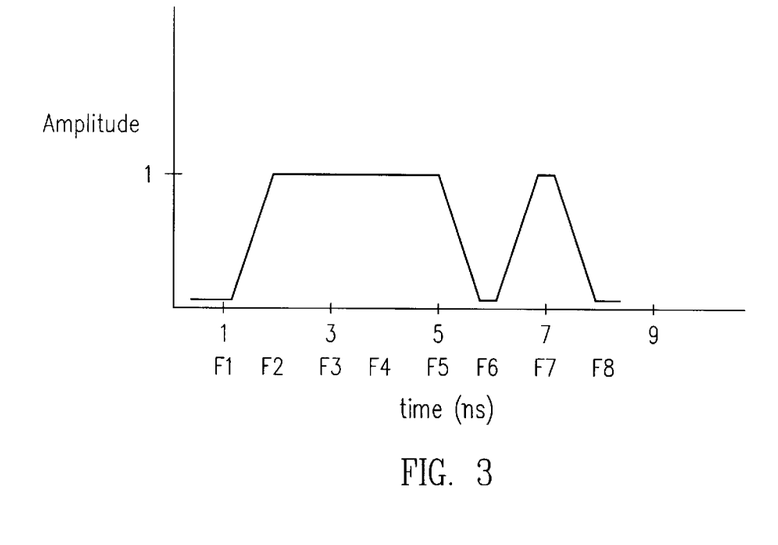
FIG. 3 shows an output waveform corresponding to a sequence of functional data programmed by a tester to occur on a terminal of the DUT.

Conditions 2) and 3) above imply that there can be no pulse width (and hence no small pulse width timing error) unless there is a transition in functional states being sent from the driver circuit of the tester to a terminal of the DUT. Accordingly, pulse width error is a function of the functional data stream arriving at the terminal of the DUT. Consider, for example, a sequence of functional data (F1–F8) "01111010", each datum being instructed by the tester to occur in this order at 1 ns intervals on a terminal of the DUT. The waveform corresponding to this sequence of functional data is shown in FIG. 3. In this case, datum F5 does not cause a transition, so has no pulse width. F6 causes a transition from 1 to 0 and has a pulse width of 4 ns. F7 causes a transition from 0 to 1 and has a pulse width of 1 ns. F8 causes a transition from 1 to 0 and has a pulse width of 1 ns. There is no pulse width timing error associated with F5, because there is no transition in functional state. There is no significant pulse width timing error associated with F6, because, though there is a transition in functional state, the pulse width here is 4 ns, which is greater than the critical value of 1.25 ns. F6 is said to be ending a pulse, but not a "short" pulse (a pulse is herein termed a "short" pulse if it is 1.25 ns or less in duration). There is a pulse width timing error associated with F7, because it causes a transition in functional state, and has a pulse width of 1 ns. F7 is said to be ending a short pulse. Similarly, there is a pulse width timing error associated with F8, because (like F7) it causes a transition in functional state and has a pulse width of 1 ns. Thus, F8 is also said to be ending a short pulse. This pulse width timing error has been found to be on the order of 30 picoseconds (ps), when the functional data occurs at 1 ns intervals. Pulse width error increases with the frequency of functional data output. For example, when the functional data occurs at 800 ps intervals, the pulse width error grows to 50 ps. As mentioned above, a pulse width timing error has been found to occur on a particular tester when the pulse width is decreased to 1.25 ns or less. Thus, to determine whether the second of two timing edges (represented by a bit of functional data) that are programmed to be 1 ns apart has a pulse width timing error, the bit of functional data must be analyzed in view of the two bits that precede it. For example, F2, F3, and F4 are required to determine the pulse width prior to F4.

There is a need to be able to correct for this pulse width timing error, especially during testing of high performance integrated circuits. For example, the very high frequency of RAMBUS 64/72 Mbit DRAM (dynamic random access memory conforming to the RAMBUS standard) demands extremely accurate testers to successfully test the devices; a timing edge placement accuracy (EPA) of +/−50 picoseconds (ps) is required. Presently, no solution has been put forward to solve this problem.

SUMMARY

The present invention is directed to methods of and apparatus for correcting for pulse width timing errors as described above. According to the current art, a test program first loads scrambler and sequencer memories (each terminal of a DUT having associated with it one of each of these memories) with information representing event timing values and event type data for the events that are to occur during a test vector, (as in the well known Schlumberger Sequencer Per Pin® architecture).

A method for correcting for pulse width timing error during testing of an integrated circuit is described. The method includes storing in a memory, associated with a selected terminal of an integrated circuit, event timing data pertaining to testing of the integrated circuit. Functional data is provided, pertaining to the testing, and it is determined if the functional data causes a state transition in the integrated circuit, the state transition causing a pulse. If a pulse is created, then the event timing data is adjusted, thereby to produce pulse width adjusted event timing. A test signal is then applied to the selected terminal of the integrated circuit, the test signal including pulse width adjusted event timing.

Two apparata for implementing the method of the present invention are herein described. One apparatus implements single value pulse width calibration. In one embodiment of this apparatus, the elements include a decoder, a source of functional data having an output terminal coupled to the decoder, and also having a second output terminal. Also included is an event sequencer, having a first set of storage locations associated with a selected terminal of the integrated circuit, and storing event timing data and event type data. The event timing data includes nominal event timing and pulse width adjusted event timing. Logic circuitry have an input terminal coupled to the output terminal of the source of functional data, and further have an output terminal. The apparatus further includes a second set of storage locations, associated with the selected terminal of the integrated circuit. The second set of set of storage locations has an input terminal coupled to the output terminal of the logic circuitry and at least one output terminal coupled to an input terminal of the first set of storage locations, the second set of storage locations storing different addressing data for the first set of storage locations. The decoder has a first input terminal coupled to receive the event timing and event type data from the first set of storage locations and a second input terminal coupled to the output terminal of the source of functional data.

According to one embodiment of the present invention, also described herein as single value pulse width calibration, additional event timing values are provided that compensate for anticipated pulse width timing errors. The additional event timing values are produced by adding a calibration factor to the nominal timing values specified by the user. Since the magnitude of pulse width timing error is a function of pulse width (duration in time), a unique calibration factor is applied for a given pulse width. Also, additional scrambler memory locations are loaded with pointers to the appropriate adjusted event timing values.

During the functional test, a series of logic gates external to the local event sequencer of the tester analyzes the stream of functional data describing event polarity during every test cycle. In one embodiment, 8 bits of functional data are provided during every test cycle; four different series of logic gates analyze 2 bits of functional data each. The logic gates determine if a given bit of functional data causes a data state transition such that it ends a "short" pulse, that is, a pulse whose width is small enough to require correction. The results of this analysis are expressed in binary form and become part of the address into the scrambler memory. The data stored at a particular scrambler memory address act as a pointer to select the location in the sequencer memory that contains the correct pulse width adjusted event timing data. Then, as in the prior art, an event type decoder combines the functional data values (supplied from a pattern data source, e.g., local memory or an algorithmic pattern generator of the tester) with the event time and event type data from the sequencer memory, provides further event timing calibration (to compensate for other factors affecting event timing) and provides an output signal to a second circuit. This second circuit converts the event time (now corrected for pulse width timing error), event type, and functional data to a corresponding event signal. The event signal is then transmitted to a driver circuit at the test head of the tester. (The DUT conventionally fits into a socket on top of a load board, which is on top of the test head). The driver circuit, in turn, changes the amplitude of the signal according to the user's requirements, and applies the signal to a particular input terminal of the DUT. The receipt of the output signals in response and their analysis is conventional.

A second apparatus implements general pulse width calibration. In one embodiment of this apparatus, the elements include a decoder, a source of functional data having an output terminal coupled to the decoder, and also having a second output terminal. Also included is an event sequencer, having a first set of storage locations associated with a selected terminal of the integrated circuit, and storing event timing data and event type data. The event timing data includes nominal event timing only. The decoder has a first input terminal coupled to receive event timing and event type data from the first set of storage locations and a second input terminal coupled to the output terminal of the source of functional data. The apparatus further includes a second set of storage locations, associated with the selected terminal of the integrated circuit. The second set of set of storage locations has an output terminal coupled to an input terminal of the first set of storage locations, the second set of storage locations storing different addressing data for the first set of storage locations. Circuitry is coupled to an output terminal of the second set of storage locations and an output terminal of the decoder. The circuitry stores event timing and event type data for recent events, and calculates a pulse width of a present event, the circuitry further having an output terminal. A lookup table is coupled to the output terminal of the circuitry, and outputs at its output port a calibration factor, thereby outputting pulse width adjusted event timing.

According to a second embodiment of the present invention, also described herein as general pulse width calibration, pulse width calculation circuitry is included in the event sequencer which maintains a history of the recent events, and calculates the pulse width of the present event by subtracting the nominal time value for the most recent event of the opposite polarity from the nominal time value of the present event. The calculated pulse width value serves as an address into a lookup table, which provides a corresponding calibration factor to be added to the event timing value to correct for its pulse width error.

The invention and its various embodiments are further discussed along with the following figures and accompanying text.

DETAILED DESCRIPTION

According to embodiments of the present invention, ATE having the Schlumberger Sequencer Per Pin® tester architecture is used, as commercially available in the Schlumberger Ltd. ATE, Model No. DX 2400. The invention is not limited to such Schlumberger ATE. With this architecture, every terminal of the DUT can be algorithmically programmed. An individual circuit, called a pin slice circuit, is associated with every terminal of the DUT to which test signals are to be applied. Each pin slice circuit includes its own memory, registers, and circuitry for generating the necessary test signals. Only portions of the tester architecture relevant to this invention are discussed here, so there is no discussion of acquisition and analysis of the output signals. This tester architecture is disclosed in further detail in commonly owned U.S. Pat. No. 5,447,139 issued Dec. 19, 1995 to West and Graeve, the disclosure of which is hereby incorporated by reference. The disclosures of related commonly owned U.S. Pat. Nos. 5,461,310, issued Oct. 24, 1995, and 5,212,443, issued May 18, 1993 are also hereby incorporated by reference.

Typically, the testing of integrated circuits by ATE involves both circuitry and software that work together. The software is a test program executed by the tester and typically includes test patterns and some programming information (typically provided by the user submitting the integrated circuits for testing) as well as more detailed programming information (typically part of the ATE). The test program first loads memory circuits with data that describes event timing values and event types for a number of events that are to occur during a test vector. Once the memory circuits are loaded, the software causes the ATE to execute and physically test the integrated circuit. After the testing of the integrated circuit is completed, a notification is transmitted back to the software. The software then reads data in various registers of the ATE and transmits the results of the testing to the user.

Figure 4:
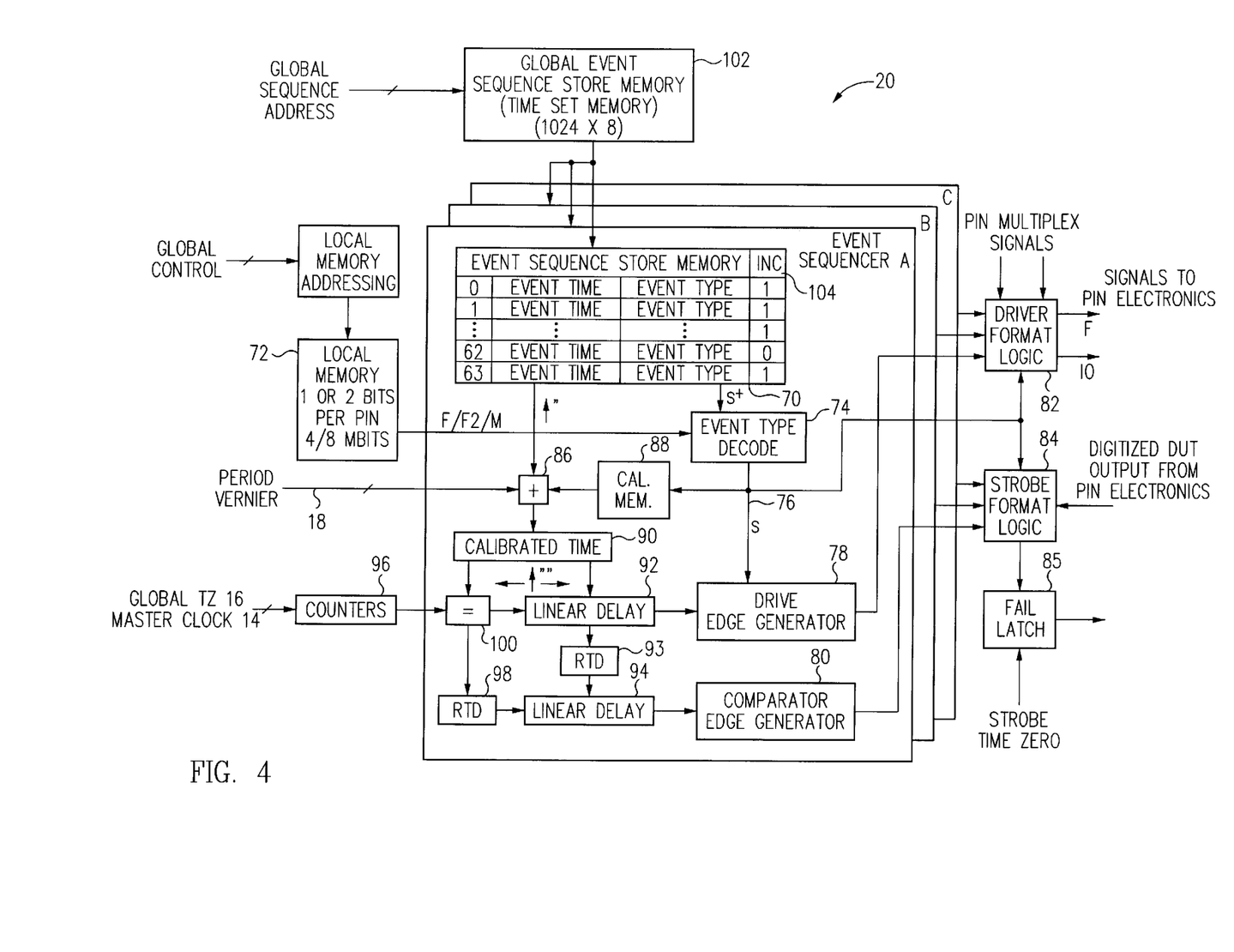
FIG. 4 is a block diagram illustrating conventional Sequencer Per Pin® tester architecture.

A block diagram of Sequencer Per Pin® tester architecture (illustrative of the prior art) is shown in FIG. 4. A Global Event Sequence Start Memory (ESSM) 102 and an Event Sequence Store Memory (ESS) 70 are associated with each relevant input terminal of the DUT. A Vector Type Select (VTS) code signal is a global sequence address supplied to all Global Event Sequence Start Memories (ESSM) 102, provided by the main event sequencer of the tester (not shown). The VTS code signal sent to each ESSM 102 is identical. However, each ESSM 102 may be loaded (programmed) differently, because different terminals of the DUT may have different functions (e.g., control terminal, address terminal, etc.). For example, if there was a global instruction to all terminals of the DUT to perform a write cycle, different terminal types would have to perform different operations. Thus, the ESSM 102 allows the preprogramming of different combinations of timing for different terminals during integrated circuit testing. The output of ESSM 102 serves as an address to a storage location in Event Sequence Store Memory (ESS) 70, which in turn provides a particular event sequence having a specified event time and event type. ESSM 102 is hereinafter also referred to as a scrambler memory, because the output from the memory is only indirectly related to its input. Data representing event sequences are loaded into each ESS 70. Event sequences describe timing values (i.e., locations of pulse edges and comparator strobes) and event types (i.e., type of pulse edge or comparator strobe) for a number of events that are to occur during a test vector. Event types include, for example, drive F (meaning go to the value of F) (DF), test for F (TF), turn the driver off (DZ) and no operation (NOP). Each ESS can store several independent events for one test cycle.

An event type decoder 74 receives the F data from a pattern data source 72 and event sequences from the ESS 70, and provides output signals describing event type S on control lines 76 to various elements, which in turn create the appropriate driver and comparator events at the DUT.

In addition to the event type, the timing for the occurrence for each event must be provided. A separate input signal to adder 86 is on period vernier lines 18 (carrying a signal indicating an offset from the time zero signal for the actual beginning of the test period). Finally, a third input signal to adder 86 is provided from a calibration memory 88. Calibration memory 88 stores timing offset values which are a function of the event type, the functional data value for the event, and the terminal of the DUT to which the signal will be sent (or from which a signal is received). The final calibrated time for the event is stored in a calibrated time register 90, and ultimately provided to the driver format logic 82 and strobe format logic 84.

When a signal is being provided to the DUT, driver format logic 82 is active. When an output signal from the DUT is to be compared to a value, strobe format logic 84 is activated. Driver format logic 82 combines the event signals from the event sequencer into the formatted F and I/O signals to the Pin Electronics (which includes a Driver Circuit 114). From driver circuit 114, a signal is sent to a terminal of the DUT 118. The Strobe Format Logic 84 compares the event signals from the event sequencers with the DUT output states to generate pass/fail status data. These elements are located in the test head of the tester (not shown).

Figure 5:
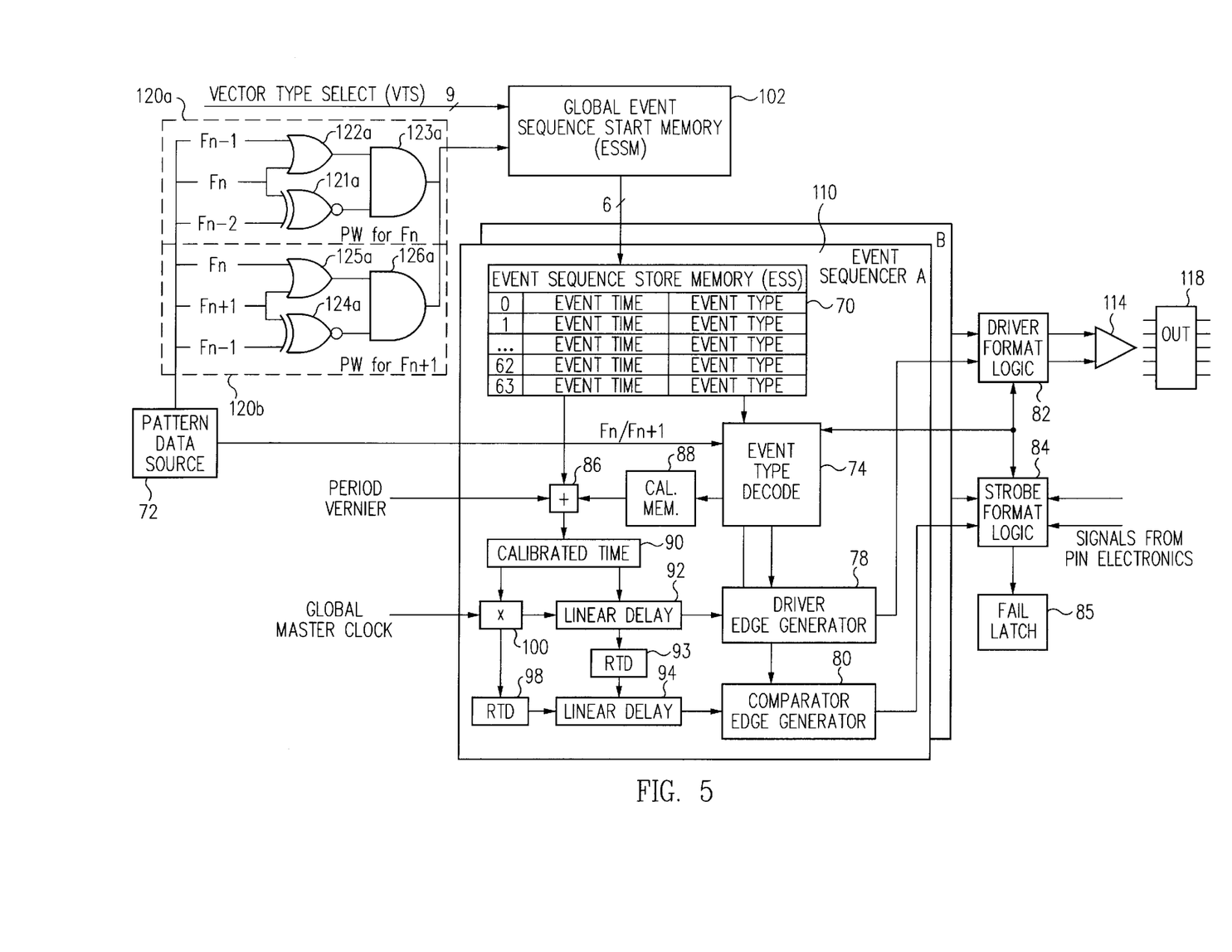
FIG. 5 is a block diagram of an apparatus in accordance with one embodiment of the present invention.
Figure 6:
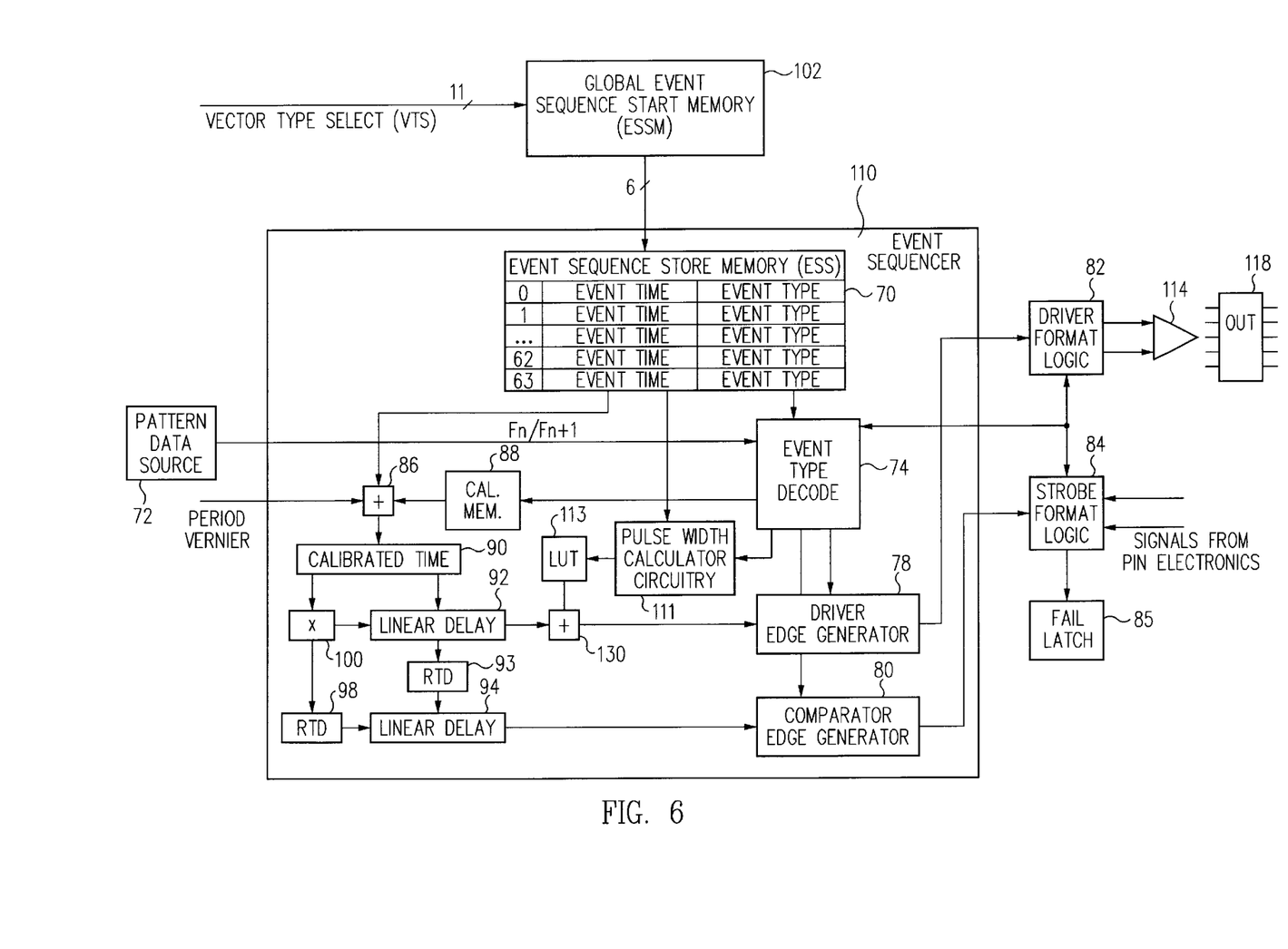
FIG. 6 is a block diagram of an apparatus in accordance with a second embodiment of the present invention.

Some elements illustrated in FIGS. 4, 5, and 6 are not discussed within this detailed description, as they are not directly related to the invention. The functions of these elements and their relationship with the elements which are discussed will be understood by those of ordinary skill in the art, especially after referring to the issued patents incorporated by reference earlier herein.

FIG. 5 is a block diagram of an apparatus in accordance with an embodiment of the present invention, which illustrates Single Value Pulse Width Calibration for 2 events. In this embodiment, each terminal of the DUT has two associated event sequencers 110, designated A and B in FIG. 5. The two outputs are provided to driver format logic 82 and, after a round trip delay, strobe format logic 84, and are ORed together in those logic circuits. By use of the two separate event sequencers A and B, a faster event rate can be generated. This is done by offsetting one event sequencer from the other by a slight amount which is less than the amount of time it would take for one sequencer to generate subsequent back-to-back events. Thus, one of the event sequencers can be loading while the other is outputting.

Each block illustrated in FIG. 5 is a conventional element, and interconnecting same would be routine to one of ordinary skill in the art. In this embodiment, the test program first loads the Global Event Sequence Start Memory (ESSM) 102 (scrambler memory) and Event Sequence Store Memory (ESS) 70 (sequencer memory) with a code (values) representing event timing data and event type data for the events that are to occur during a test vector, as in the usual Sequencer Per Pin® architecture. However, additional event timing data values are provided to the sequencer memory that reflect variations on event timing values specified by the user due to pulse width timing error, which is an error not compensated for by calibration memory 88 in the usual Sequencer Per Pin® architecture.

The additional event timing values are produced by adding a calibration factor to the nominal timing values specified by the user. Since the magnitude of pulse width timing error is a function of pulse width (duration in time), a unique calibration factor is applied for a given pulse width. Similarly, additional locations are loaded into the scrambler memory which will point to the appropriate timing values (i.e., with and without compensation for pulse width error). Since this embodiment has logic circuitry to analyze 2 events simultaneously, the number of additional ESS locations required is 3, representing variations for the following conditions: 1) the first event creates a short pulse, requiring a correction, 2) the second event creates a short pulse, requiring correction, and 3) both events create short pulses, requiring correction. Thus, if the user's test program requires 5 event sequences for a certain terminal, the software will provide 20 (the 5 event sequences with the nominal timing input by the user, plus 3 variations on the nominal timing for each of the 5 event sequences). Accordingly, to achieve pulse width calibration in this embodiment, the ESSM 102 will require 4 times the number of locations required when there is no pulse width calibration.

Circuitry analyzes the stream of functional data (provided by the pattern data source 72) describing event polarity during every test cycle, and determines if a given bit of functional data ends a "short" pulse. The results of this analysis are expressed in binary form and become part of the address into the scrambler memory. The resulting output from the scrambler memory location, in turn, addresses the location in the sequencer memory that contains the correct pulse width adjusted event timing data.

For example, the user might specify in the test program as an event pair for a terminal of the DUT 118, Drive F1 at 1 ns, Drive F2 at 2 ns. The test program then loads the scrambler memory 102 and sequencer memory 70 with data representing the nominal event timing and event type for this event pair, and will also load the sequencer memory 70 with variations on nominal event timing which compensate for pulse width timing error. The three variations on event timing include: apply pulse width calibration factor to nominal timing for first event only (e.g., Drive F1 at 1.03 ns, Drive F2 at 2 ns), apply pulse width calibration factor to nominal timing for second event only (e.g., Drive F1 at 1 ns, Drive F2 at 2.03 ns), and apply pulse width calibration factor to nominal timing for both the first and second events (e.g., Drive F1 at 1.03 ns, Drive F2 at 2.03 ns). The pulse width corrected event timing value from ESS 70 is then provided to adder 86, and combined with the timing offset value provided by calibration memory 88. The final calibrated time for the event is stored in a calibrated time register 90, and ultimately provided to the driver format logic 82 and strobe format logic 84.

In the cited example, the calibration factor is +0.03 ns (+30 ps) for events occurring at 1 ns intervals. However, in this embodiment, the system can compensate for only one small pulse value at a time (e.g., 1 ns or 900 ps). This is so because the ESS 70 and ESSM 102 must be reloaded to apply a different calibration factor (which would compensate for a different pulse width value). Thus, this embodiment assumes that all drive events are separated by a fixed time interval (i.e., there is only one possible pulse width), and that only pulses which are exactly as wide as that time interval need to be corrected; pulses that are greater in width do not need correction.

In this embodiment, the sequencer memory 70 is 64×52 bits in size. Since 52 bits are required to describe the event time and event type for each event pair in this embodiment, the sequencer memory 70 accommodates 64 event pairs. Fewer scrambler memory and sequencer memory locations per terminal per test cycle are actually available to the user in this embodiment than in the usual Sequencer Per Pin® architecture—512 instead of 2028 and 16 instead of 64, respectively—but edge placement accuracy (EPA) for an event is increased, because the pulse width timing error associated with the fixed time interval between events is accounted for.

As described above, circuitry in FIG. 5 analyzes the stream of functional data (provided by the pattern data source 72) describing event polarity during every test cycle, and determines if a given bit of functional data ends a "short" pulse. Detail regarding the operation of the circuitry is disclosed hereinafter. After the ESSM 102 and ESS 70 have been loaded, a signal is sent to logic circuitry 120a, 120b (contained within dashed outlines in FIG. 5) that initiates its operation. The contents of the ESSM 102 and ESS 70 are not re-written during test; they are only rewritten during setup for the next test. Logic circuitry 120a, 120b (external to the local event sequencer 110 of the tester) analyze part of the stream of F data as it is supplied by the pattern data source 72 of the tester during every test cycle. In one embodiment, 8 bits (1 byte) of functional data, $F_n$–$F_{n+7}$, are supplied each test cycle, with each bit being analyzed by one circuit. Functional data bit $F_n$ is analyzed by circuit 120a and $F_{n+1}$ is analyzed by circuit 120b. For clarity of presentation, the circuits analyzing $F_{n+2}$ through $F_{n+7}$ are not shown, but are identical to the circuits analyzing $F_n$ and $F_{n+1}$. The analyses performed by circuitry 120a and 120b determine whether a given event ends a "short" pulse, and thus, whether pulse width calibration is required for the event (as described earlier). The results of these analyses (expressed in binary form) become, in one embodiment, 2 bits of the 11 bit vector type select (VTS) code which addresses the ESSM 102. The value of these 2 bits selects from among the 4 possible locations in ESSM 102 for the specific 9-bit VTS code, and these locations in turn select from the 4 possible variations on the timing values in ESS 70. The following logical statement is determined by logic gates, including EXCLUSIVE NOR gate 121a, OR gate 122a, and AND gate 123a as shown:

$$F_n = F_{n-2} \neq F_{n-1}$$

If the statement is true (i.e., $F_n$ ends a short pulse), then the binary result which is to be transmitted to the ESSM 102 and ESS 70 is 1; if false (i.e., $F_n$ does not end a short pulse), then the binary result which is to be transmitted to the ESSM 102 and ESS 70 is 0. Thus, for example, if the values of the functional data were 0, 0, and 1 for $F_n$, $F_{n-2}$ and $F_{n-1}$, respectively, then the statement is true (i.e., $F_n$ does end a short pulse) and there would be an associated pulse width timing error. Accordingly, a calibration factor needs to be applied to correctly place (in time) the trailing edge of the pulse.

Next, to determine if $F_{n+1}$ ends a short pulse, the following logical statement is determined by logic gates, including EXCLUSIVE NOR gate 124a, OR gate 125a, and AND gate 126a as shown:

$$F_{n+1} = F_{n-1} \neq F_n$$

If the statement is true (i.e., $F_{n+1}$ ends a short pulse), then the binary result which is to be stored in the ESSM 102 and ESS 70 is 1; if false (i.e., $F_{n+1}$ does not end a short pulse), then the binary result which is to be stored in the ESSM 102 and ESS 70 is 0. Thus, for example, if the values of the F data were 0, 0, and 0 for $F_{n+1}$, $F_{n-1}$, and $F_n$, respectively, then the statement is false. $F_{n+1}$ does not end a "short" pulse. Accordingly, there is no pulse width error to be accounted for, and no calibration factor should be applied. Therefore, in this example, the binary results of the analysis of functional data bits $F_n$ and $F_{n+1}$ would be "10". The 2 bits together act as a pointer for selecting the correct ESS 70 address that says, in this case, "apply calibration factor to nominal timing for first event only" (e.g., Drive $F_n$ at 1.03 ns, Drive $F_{n+1}$ at 2 ns).

Functional data bits $F_{n+2}$ through $F_{n+7}$ are analyzed in similar fashion. The above logical statements are embodied in, for example, exclusive NOR, OR and AND gate circuitry, as shown in FIG. 5, but this is not limiting.

According to another embodiment of the invention, illustrated by FIG. 6, and having many elements similar to those of FIG. 5, a more substantial modification is made to the Event Sequencer 110 itself to achieve general pulse width timing calibration. In this embodiment of the invention, Event Sequencer 110 is able to accommodate 8 events in a given period of time. In contrast to the embodiment illustrated in FIG. 5, wherein there are two event sequencers per terminal, there is only one event sequencer per terminal in this embodiment. This is so because of the operating premise underlying implementation of this embodiment, which requires that the timing value of the prior event must be known. If the timing value of the prior event was resident on a second event sequencer, then this data couldn't be retrieved in a reasonable period of time.

The operating premise underlying this embodiment of the invention is direct calculation of a pulse width, and provision of a calibration factor corresponding to the calculated pulse width. Accordingly, pulse width calculation circuitry 111 is provided in this embodiment. Pulse width calculation circuitry 111 includes three elements known to those of ordinary skill in the art: a register, a comparison circuit, and a subtraction circuit. The register stores event polarity data for the prior event. The comparison circuit examines the polarity of the present event, and compares it with the polarity of the prior event (stored in the register). If the polarities of the present event and the prior event are the same, then the comparison circuit does nothing. However, if the polarity of the present event is opposite to the polarity of the prior event, the comparison circuit triggers two actions. The subtraction circuit is activated, and calculates the pulse width of the present event by subtracting the nominal time value of the prior event from the nominal time value of the present event. The calculated pulse width value then serves as an address to a storage location in lookup table 113, which in turn outputs from that storage location a corresponding calibration factor (i.e., calibration factor corresponds to the calculated pulse width). Adder 130 adds this calibration factor to the event time value stored in calibrated time register 90 to correct for the pulse width timing error. The register of Pulse Width Calculation circuitry 111 is then updated, so that the present event polarity data becomes the prior event polarity data, and the steps just described are repeated for the next event.

This second embodiment compensates for pulse width timing errors for any pulse width value within the same pattern, while the first embodiment assumes that all pulse widths are either one specific value, or are long enough not to require correction. In addition, the second embodiment compensates for pulse width timing error without using address locations in scrambler memory ESSM 102 or sequencer memory ESS 70, and thus the same number of scrambler memory and sequencer memory locations per terminal per test cycle are available to the user as in the Sequencer Per Pin® tester architecture—2028 and 64, respectively.

FIGS. 5 and 6 illustrate exemplary apparata for implementing these embodiments. embodiments will be apparent to one of ordinary skill in the art and are intended to fall the scope of the appended claims.

I claim:

1. A method for correcting for pulse width timing errors for testing an integrated circuit, comprising the acts of:
    (a) storing in a memory, associated with a selected terminal of said integrated circuit, event timing data pertaining to testing of said integrated circuit;
    (b) providing functional data pertaining to said testing;
    (c) determining if said functional data causes a state transition in said integrated circuit, said state transition creating a pulse;
    (d) adjusting said event timing data, thereby to produce pulse width adjusted event timing; and
    (e) generating a test signal to be applied to said selected terminal, said test signal including said pulse width adjusted event timing.

2. The method of claim 1, further including transmitting said test signal to said selected terminal of said integrated circuit.

3. The method of claim 1, wherein said functional data specifies polarity of events to occur during said testing.

4. The method of claim 1, wherein said state transition causes a pulse having a duration of 1.25 nanoseconds or less.

5. The method of claim 1, wherein said event timing data includes pulse width adjusted event timing, said timing being obtained by adding a calibration factor to an event timing datum stored in said memory, the magnitude of said calibration factor being a function of the duration of said pulse.

6. The method of claim 5, wherein said pulse duration is 1.25 nanoseconds and said calibration factor is +0.03 nanoseconds.

7. The method of claim 1, wherein said memory stores at least 3328 bits of data.

8. The method of claim 1, further comprising providing said functional data from a pattern data source.

9. The method of claim 1, further comprising generating said functional data.

10. Apparatus providing test signals to an integrated circuit under test, comprising:
    a decoder;
    a source of functional data having a first output terminal coupled to said decoder, and further having a second output terminal;
    an event sequencer, including a first set of storage locations associated with a selected terminal of said integrated circuit, and storing event timing data and event type data, said event timing data including nominal event timing and pulse width adjusted event timing;
    logic having an input terminal coupled to said second output terminal of said source of functional data, and further having an output terminal;
    a second set of storage locations, associated with said selected terminal of said integrated circuit, having an input terminal coupled to said output terminal of said logic and at least one output terminal coupled to an input terminal of said first set of storage locations, said second set of storage locations storing different addressing data for said first set of storage locations;

said decoder having a first input terminal coupled to receive said event timing and event type data from said first set of storage locations and a second input terminal coupled to said output terminal of said source, and providing a test signal to said integrated circuit.

11. The apparatus of claim 10, wherein said source of functional data is a memory.

12. The apparatus of claim 10, wherein said source of functional data is a pattern generator.

13. The apparatus of claim 10, wherein said first set of storage locations stores at least 3328 bits of data.

14. The apparatus of claim 10, wherein said pulse width adjusted event timing is obtained by adding a calibration factor to an event timing value stored in said first set of storage locations, the magnitude of said calibration factor being a function of the duration of said pulse.

15. The apparatus of claim 14, wherein said pulse duration is 1.25 nanoseconds or less and said calibration factor ranges from about +0.03 nanoseconds to +1.0 nanoseconds.

16. Apparatus providing test signals to an integrated circuit under test, comprising:

a decoder;

a source of functional data having an output terminal coupled to said decoder;

an event sequencer, including a first set of storage locations associated with a selected terminal of said integrated circuit, and storing event timing data and event type data, said event timing data including nominal event timing;

a second set of storage locations, associated with said selected terminal of said integrated circuit, having at least one output terminal coupled to an input terminal of said first set of storage locations, said second set of storage locations storing different addressing data for said first set of storage locations;

circuitry coupled to an output terminal of said second set of storage locations and an output terminal of said decoder, said circuitry storing event timing and event type data for recent events, and calculating a pulse width of a present event, said circuitry having an output terminal; said decoder having a first input terminal coupled to receive said event timing and event type data from said first set of storage locations and a second input terminal coupled to said output terminal of said source, and providing a test signal to said circuitry; and a lookup table having an address port coupled to the output terminal of said circuitry, outputting at its output port a calibration factor, thereby outputting pulse width adjusted event timing.

17. The apparatus of claim 16, wherein said source of functional data is a memory.

18. The apparatus of claim 16, wherein said source of functional data is a pattern generator.

19. The apparatus of claim 16, wherein said first set of storage locations stores at least 3328 bits of data.

20. The apparatus of claim 16, wherein said pulse width is calculated by subtracting the time value of the most recent event of the opposite polarity from the time value of the present event.

21. The apparatus of claim 16, wherein said circuitry comprises:

a register for storing said event timing and said event type data for said prior event, said register having an output terminal;

a comparison circuit having input terminals for comparing the polarity of said present event to the polarity of said prior event, and further having an output terminal; and a subtraction circuit having an input terminal coupled to the output terminal of said comparison circuit, said subtraction circuit subtracting the event timing value for said prior event from said timing value of said present event.

* * * * *